United States Patent [19]

Cedrone et al.

[11] Patent Number: 4,641,738

[45] Date of Patent: Feb. 10, 1987

[54] MOMENTUM ARRESTING DEVICE FOR AN INTEGRATED CIRCUIT TESTER

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 800,097

[22] Filed: Nov. 20, 1985

Related U.S. Application Data

[63] Continuation of Ser. No. 497,208, May 23, 1983, abandoned.

[51] Int. Cl.[4] .............................................. B65G 11/20
[52] U.S. Cl. ........................................ 193/40; 29/741; 29/759
[58] Field of Search .................... 193/40, 32; 29/741, 29/759, 564.1; 267/153, 154; 74/469, 526; 273/53; 221/307, 310

[56] References Cited

U.S. PATENT DOCUMENTS 2,572,312 10/1951 Burge et al. ............................ 193/32
3,330,401 7/1967 Ahlstedt ................................ 193/32
4,000,798 1/1977 Cedrone ................................ 193/40

Primary Examiner—Andres Kashnikow
Assistant Examiner—L. E. Williams
Attorney, Agent, or Firm—Kenway & Jenney

[57] ABSTRACT

A device that brings a vertically falling integrated circuit to a rapid, bounce-free stop at a test site includes a set of relatively lightweight blades arrayed next to the fall path with their faces in a mutually spaced relationship. At its upper end, each blade is pivotally and loosely mounted on an energy absorbing elastomeric sleeve. At its lower end, each blade carries a stop member that projects into the fall path when the blade is in a first ("test") position. The stop members are generally aligned with one another horizontally across the fall path to define a stop surface that precisely locates an integrated circuit at the test site. The device includes an arrangement for repeatedly drawing the lower ends of the blades in unison to a second ("release") position where the stop members are clear of the fall path.

4 Claims, 3 Drawing Figures

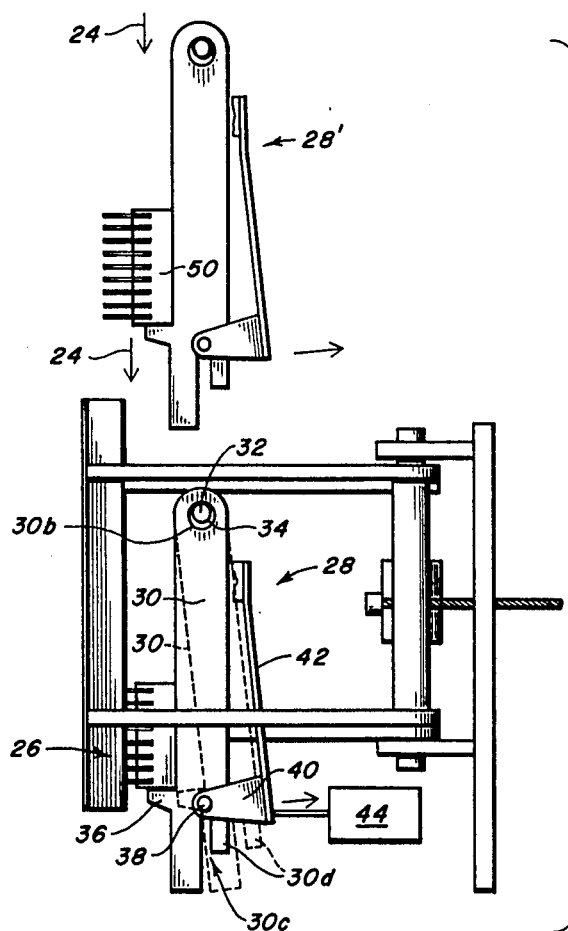
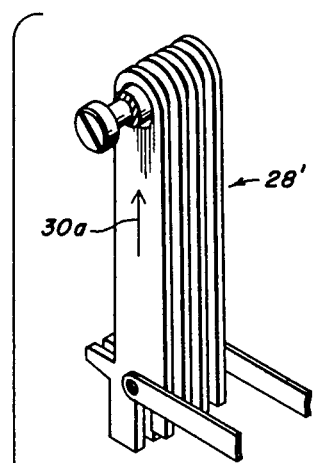
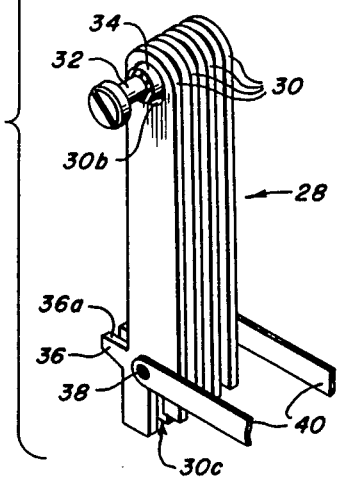
FIG. 2
FIG. 3

MOMENTUM ARRESTING DEVICE FOR AN INTEGRATED CIRCUIT TESTER

This is a continuation of application Ser. No. 497,208, filed May 23, 1983, now abandoned.

BACKGROUND OF THE INVENTION

This invention relates in general to inertial arresting devices and in particular to a device for use in an integrated circuit test handling and sorting apparatus that rapidly brings a free falling integrated circuit to a bounce-free stop at a test site, holds it at the site during the test, and then releases it for further processing.

In the manufacture of integrated circuits (IC's) and the like, it is important to test each IC reliably and at a high throughput rate. Typically modern IC testers operate at rates in excess of 5,000 IC's per hour with each IC being tested in an interval of approximately 100 milliseconds. In addition to these time constraints, the design of a successful, high-speed IC tester should take into account that (1) the most effective feeding arrangement uses a generally vertical free fall along a test path and (2) the free-falling IC must be stopped at a test site having a precisely known location. One problem inherent in this design approach is that if the falling IC strikes a rigid member that stops and locates it at a test site, the IC will bounce up from that member. If the test must wait for the IC to "settle down" on the member, this delay will significantly slow the production speed of the entire tester. Another problem is that the IC's usually have rectilinear, box-like ceramic bodies that are easily chipped. If they strike a fixed, rigid surface with a corner of the body, there is a significant likelihood that the IC will be damaged.

U.S. Pat. No. 4,000,798, issued to one of the present inventors, describes a prior solution to the "bounce" problem. A pivoted "foot" projects into the free fall path to provide a rigid stop member that locates an IC at the test site. Just before the falling IC lands on the foot, however, it strikes a pendulum mass. This impact absorbs a portion of the kinetic energy of the falling IC. The impacted pendulum swings away from the IC, strikes an abutment surface, and returns to clamp the IC against a rail member. Where the IC has a particularly large mass, this clamping is important to hold the IC on the foot. While this arrangement has worked very well in commercially successful handler/testers, it does not address the further problem of arresting the fall of "misaligned" IC's without damage. Also, this pendulum arrangement does not deal as well as possible with the problem of handling IC's of varying mass and size and it is not as cost effective as desired.

It is therefore a principal object of the present invention to provide an arresting device that rapidly brings a free-falling IC to a bounce-free stop at an accurately known location without damaging the IC, even when it is oriented during its fall so that it lands on one of its corners.

Another object is to provide an arresting device with the foregoing advantages that can accommodate IC's of any standard mass or size.

A further object is to provide an arresting device with the foregoing advantages that has a comparatively low cost of manufacture.

SUMMARY OF THE INVENTION

A succession of integrated circuits (IC's) are fed one at a time along a generally vertical free fall path to a test site. A momentum arresting device brings each IC to a bounce-free stop at the test site, holds it there during a test, and then releases it for further processing. The arresting device has a set of thin blades, each with a comparatively low mass, that are arrayed adjacent the fall path with their faces in a spaced apart relationship.

Each blade supports a stop member, preferably an integrally formed projection with a horizontal upwardly facing surface. The blades are mounted to absorb the kinetic energy of the impact of a falling IC landing one or more of the stop members. In the preferred form, the blades are pivotally mounted at their upper end on a pin that carries a sleeve of an energy absorbing elastomeric material. The pin and sleeve preferably are loosely fitted in aligned, oversized openings formed in each blade. Preferably the thickness of the elastomeric sleeve is selected in conjunction with the energy absorbing qualities of the elastomeric material so that an impact of the IC on one of the blade stop members (as when the IC is "cocked" as it falls) does not produce a bounce or damage to the body of the IC before the impact rotates the IC to engage other blade stop members. The number and spacing of the blades is also a function of the width, and hence the mass, of the IC. A small IC is often sufficiently narrow to impact only a portion of the blades. A wider and heavier IC will usually engage all of the blades, typically engaging them sequentially as the "cocked" IC assumes a horizontal orientation.

The blades pivot under the control of a drive assembly to a second, "release" position where their stop members are clear of the fall path. The drive assembly includes a drive pin that extends through aligned, open slots preferably formed in the lower end of each blade. The pin is supported at its ends in a yoke which in turn is supported on a resilient member that biases the blades toward the first position. A solenoid or an equivalent drive member draws the yoke against the spring force of the resilient member to the second position.

These and other features and objects of the present invention will be more fully understood from the following detailed description which should be read in light of the accompanying drawings.

BRIEF DESCRIPTION OF THE DRAWINGS

FIG. 2 is a simplified view in side elevation of two vertically spaced inertial arresting devices according to the present invention that are operated in tandem to feed the IC's to a test site defined by stop members of the lower device; and FIG. 3 is a more detailed view in perspective of the inertial arresting devices shown in FIG. 2 with portions of the reciprocating drive assembly removed for clarity.

DETAILED DESCRIPTION OF THE PREFERRED EMBODIMENTS

Figure 1:
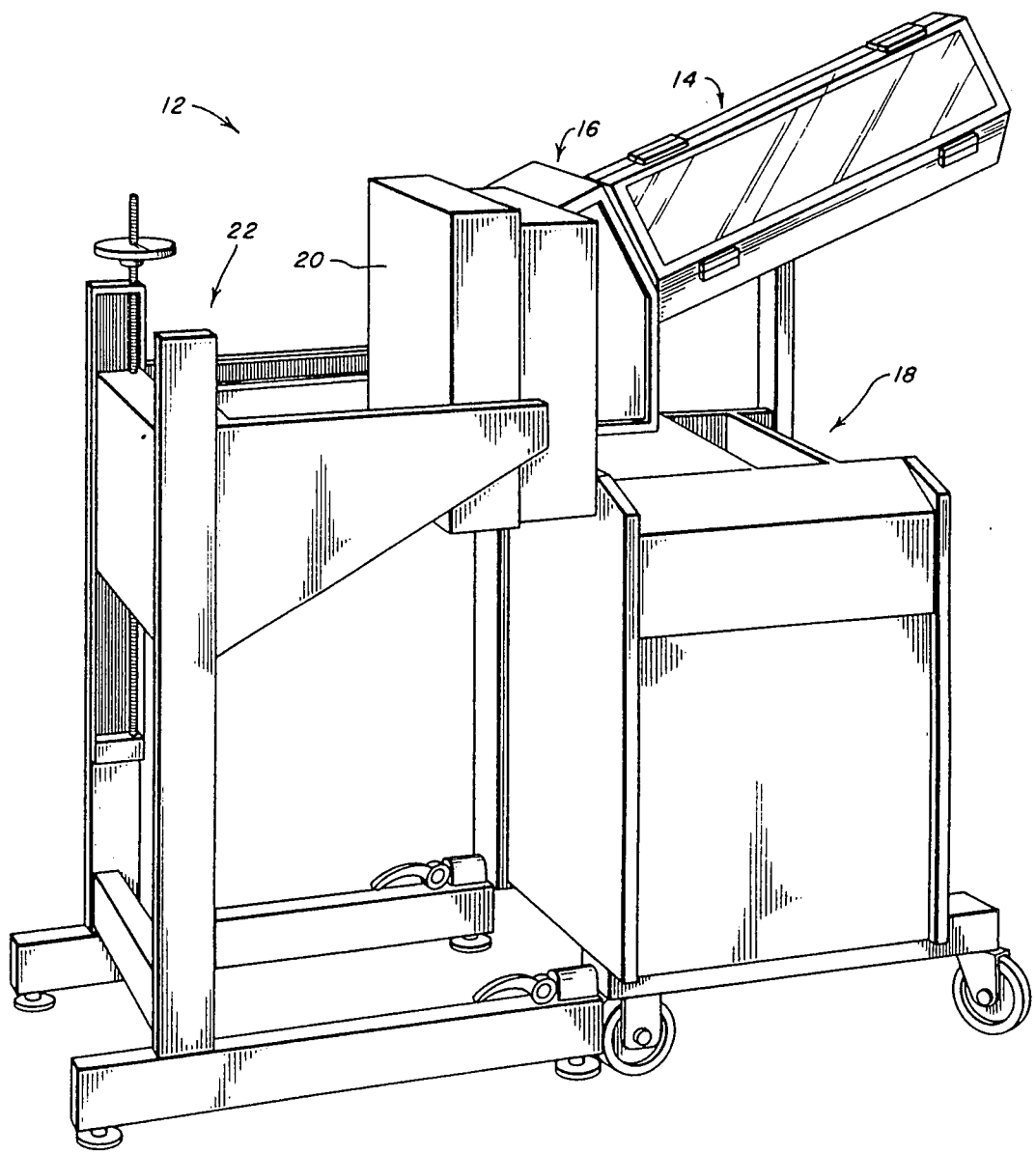
FIG. 1 is a simplified view in perspective of a high speed machine for testing IC's that utilizes a momentum arresting device according to the present invention to bring a succession of vertically falling IC's to a bounce-free stop at a test site.

FIG. 1 shows a high speed integrated circuit (IC) test handling and sorting apparatus 12 that includes a storage unit 14, a test assembly 16, a sorter 18 and test circuitry 20 mounted on a frame 22 and positioned immediately adjacent a test site 26 (FIG. 2) for the IC's proceeding through the test assembly 16. A steady succession of IC's are fed from the storage unit 14 to the test assembly 16. The IC's each have a generally rectilinear, box-like body that is often formed of a ceramic that is easily chipped by an impact. The IC's also may include two parallel rows of leads that extend from the sides of the body generally in the direction of a normal to one face of the body (as shown in FIG. 2). Through the apparatus 12 the IC's move generally in a line with the end faces on one IC abutting end faces of adjacent IC's. The IC's enter the test assembly 16 at an acute angle with respect to the horizontal (determined by the inclination of the storage unit 14 itself, as shown), but are reoriented in a conventional manner for a vertical, freefall movement through the test assembly along a path 24 to the sorter 18. The test assembly includes the test site 26 where the IC's, one-by-one, momentarily come to rest and undergo a rapid electronic testing under the control of the circuitry 20. Depending upon the results of the test, the tested IC when released from the test site, is directed by the sorter 18 to one of several collecting bins or tubes (not shown). The operation of the apparatus 12 is continuous, automatic and at a high speed. Typical throughput rates for standard sixteen lead IC's are 6000 per hour with a typical test time of 200 milliseconds.

A principal feature of the present invention is a momentum arresting device 28 that includes a set of blades 30 30 located adjacent the fall path 24 and mounted for pivotal movement about a mounting pin 32 and a sleeve 34 of an energy absorbing elastomeric material carried on the pin. Each blade 30 is preferably formed from a piece of thin structural sheet material and has a comparatively small mass, e.g. seven grams with a thickness of approximately 50 mils.

The blades each extend generally vertically along their longitudinal axes 30a. The faces of the blades (a device having four blades is illustrated) are in a mutually spaced, parallel relationship so that they each act independently of one another. A circular opening 30b in each blade receives the pin 32 and sleeve 34 in a loose fitting relationship (the opening 30b is oversized). An open, vertically extending slot 30c formed in the lower end of each blade accepts a drive pin 38. A "rear" lower portion 30d of each blade is shortened to facilitate the coupling of the blades 30 to the drive pin 38.

The blades 30 each have a stop member 36 formed integrally with the blade and extending transversely to its principal axis 30a. The stop members have upwardly facing, generally flat surfaces 36a that lie in a common horizontal plane. The surfaces 36a of the blades together form a stop surface that intercepts the fall of each IC and holds it at the test site 26, as shown in FIG. 2, for testing.

When the blades are in a first "test" position, as shown in solid lines in FIG. 2 and in FIG. 3, the stop members project into the path 24 so that an IC falling down the path strikes the upper surface 36a of at least one of the blades. If the IC is "properly" oriented, with its end faces horizontal, then it will impact all four surfaces 36a substantially simultaneously and the force of the impact will be distributed among the four blades generally uniformly. If the IC, however, is "cocked" as it descends, as is usually the case, its leading corner will impact on one of the blades before the rest of the IC. Depending on the degree to which the IC is cocked, this one blade will absorb a disproportionate share of the impact until the IC rotates about this corner and descends farther to engage other stop members 36. As other members are engaged in a "ripple" or sequential manner, they assist in absorbing the kinetic energy of the falling IC.

The elastomeric sleeve 34 is sufficiently thick to absorb all or most of the kinetic energy of the impacting IC, regardless of the size or mass of the IC and regardless of its orientation on impact. For a rubber sleeve, a thickness of approximately 1/12 inch is sufficient. It should be noted that the use of thin, spaced apart blades enhances the ability of the sleeve 34 to absorb energy since each blade impacted by the IC will compress the elastomeric material in a better energy absorbing mode than if the impact force were distributed over a large area. It is also significant that not only does each blade have a low mass, but it is resiliently mounted. As a result, the IC impacting on a blade encounters a stop with a low "effective" mass. Put in other terms, if the stop were rigidly fixed in space, it would appear to an impacting IC to have an infinite mass (applying the formula F=ma and there is substantially no acceleration of the stop). With an infinitely soft suspension, the apparent or effective mass of the stop and blade would be zero. The blade and stop of the present invention have a finite effective mass, but one that is sufficiently low that there is little likelihood of damage to the impacting IC.

A drive assembly 40 that includes the drive pin 38, a yoke 40, a resilient spring member 42, and a solenoid 44 moves the blades in unison between a first, "test" position and a second, "release" position (shown in phantom in FIG. 2). In the release position, the stop members 36 are clear of the path 24 and the IC that was held on the stop members at the test site during testing is free to fall into the sorter 18. The ends of the drive pin are mounted between the arms of the yoke 40 which in turn is secured to the lower end of the member 42. Because the pin 38 is captured in the slots 30c of each blade 36, they will move in unison in a rotating movement about the pin 32 and sleeve 34 in response to a lateral movement of the pin. The depth of the slots 30c ensures that the pin 38 will not slide out of the slots 30c during normal operation. The member 42 biases the blades toward the first position. The solenoid 44 draws the yoke, and therefore the pin 38 and the blades, to the second position in opposition to the member 42.

As shown in FIGS. 2 and 3, the arresting device 28 of the present invention is preferably used in vertically spaced tandem pairs. An "upper" device 28' supports an IC 50 which will subsequently drop to test position. This IC has been reoriented within the test assembly 16 and is proceeding down the vertical path 24. When the device 28' goes through a cycle of operation (the blades are drawn to the release position and then returned to the stop position), the IC 50 in the device 28' is released so that it can free fall to the stop mempers 36 of the device 28. The kinetic energy of the IC is, of course, equal to $\frac{1}{2}mv^2$ where m is its mass and v is its terminal velocity as it strikes the lower stop member 36. Ignoring frictional losses and any affects introduced by the surrounding air, this kinetic energy is also equal to mgh, where g is the acceleration due to gravity and h is the height through which the IC has fallen (the vertical distance between the upper and lower stop members 36). Clearly the use of this pair of devices 28', 28 reduces the value of h and therefore controls the amount of kinetic energy that a falling IC will have as it strikes the stop member of the lower device 28. A typical value for h is three inches. As noted above, the operation of the "lower device 28 is cycled to bring each falling IC to a rapid, bound-free stop, hold it momentarily for the test, move to its second position to release the tested IC to the sorter, and then return to the first position to receive the next IC.

While the invention has been described with respect to its preferred embodiment, there are various modifications which will occur to those skilled in the art from the foregoing detailed description and the accompanying drawings. For example, the blades 30 can be mounted using open, hook like members rather than closed, interior openings. The elastomeric sleeve can be a pad interposed between the pin and the blades. More generally, the elastomeric energy absorbing can occur in a more complex suspension at a point removed from the direct interface between the blades and the pin. The stop members have been described as integral with the blades and having horizontal holding surfaces; they can be separate members and the holding surfaces are not necessarily horizontal. Also, the blades can assume a wide variety of configuration provided that they are light. Further, while the blades have been described as moving the stop members through a pivoting motion, other modes of movement are possible such as a direct lateral movement of the entire blade set together with an energy absorbing suspension. These and other modifications are intended to fall within the scope of the appended claims.

What is claimed is:

1. A momentum arresting device for use in an apparatus for testing integrated circuits that are successively dropped along a generally vertical free fall path to a test site, comprising a plurality of blade members each extending in a generally vertical direction and located adjacent said free fall path with the adjacent faces of said blade members in a mutually spaced relationship along a first horizontal axis perpendicular to said free fall path, stop members carried on said blade members that each project along a second horizontal axis orthogonal to said free fall path and said first horizontal axis when said blade members are in a first position, said stop members having upper surfaces that are generally horizontally aligned to form a stop surface that precisely locates said free falling integrated circuits at said test site which they impact and come to rest on said stop, means for repeatedly moving said blades between said first position and a second position where said stop members are clear of said free fall path, and an elastomeric member that supports said blade members for absorbing the energy of said integrated circuits free falling along said path as they strike said stop members, wherein said blade moving means comprises a mounting pin extending generally in the direction of said first horizontal axis that pivotally engages each of said blade members near its upper end and means for reciprocating the lower ends of said blade members in a rotating movement about said mounting pin to move said blade members and said stop members between said first and second positions, wherein said elastomeric member is a sleeve carried on said pin and having a sufficient thickness given the energy absorbing characteristics of the material forming said elastomeric member and given the thickness and mass of said blades to bring said falling integrated circuits to a rapid, bounce-free stop at said test site.

2. The arresting device according to claim 1 wherein each of said blade has an opening in its upper end that receives said pin and said elastomeric sleeve in a loose fitting relationship.

3. The arresting device according to claim 1 wherein said reciprocating means comprises an open slot formed in the lower end of each of said blades and a drive pin that simultaneously engages each of said open slots.

4. The arresting device according to claim 1 further comprising means for mounting said drive pin, said mounting means including a resilient member that biases said drive pin and said blade members to said first position and drive means for drawing said drive pin and said blade means to said second position against said biasing means.

* * * * *